United States Patent
Lee et al.

(10) Patent No.: US 6,384,449 B2
(45) Date of Patent: May 7, 2002

(54) NONVOLATILE MEMORY AND METHOD FOR FABRICATING THE SAME

(75) Inventors: Ki Jik Lee; Jae Min Yu, both of Chungcheongbuk-do (KR)

(73) Assignee: Hyundai Electronics Industries Co., LTD, Kyoungki-do (KR)

( * ) Notice: Subject to any disclaimer, the term of this patent is extended or adjusted under 35 U.S.C. 154(b) by 0 days.

(21) Appl. No.: 09/842,897

(22) Filed: Apr. 27, 2001

Related U.S. Application Data

(62) Division of application No. 09/295,447, filed on Apr. 21, 1999, now Pat. No. 6,255,155.

(30) Foreign Application Priority Data

Apr. 23, 1998 (KR) ............................................. 98-14580
Apr. 2, 1999 (KR) ............................................. 99-11612

(51) Int. Cl.[7] .............................................. H01L 29/78
(52) U.S. Cl. ...................................... 257/315; 257/774
(58) Field of Search ................................. 257/315, 774

(56) References Cited

U.S. PATENT DOCUMENTS

| | | | |
|---|---|---|---|
| 5,445,983 A | 8/1995 | Hong | |
| 5,532,181 A | 7/1996 | Takebuchi et al. | |
| 5,534,456 A | 7/1996 | Yuan et al. | |
| 5,550,075 A | 8/1996 | Hsu | |
| 5,643,812 A | 7/1997 | Park | |
| 5,790,457 A | 8/1998 | Kim et al. | |
| 5,838,615 A | 11/1998 | Kamiya et al. | |
| 5,851,880 A | 12/1998 | Ikegami | |
| 5,877,980 A | 3/1999 | Mang et al. | |
| 5,900,661 A | 5/1999 | Sato | |
| 5,943,262 A | 8/1999 | Choi | |
| 5,959,328 A | * 9/1999 | Krautschneider et al. | |
| 5,959,888 A | 9/1999 | Araki et al. | |
| 5,960,283 A | 9/1999 | Sato | |
| 5,990,514 A | 11/1999 | Choi et al. | |
| 5,998,251 A | 12/1999 | Wu et al. | |
| 6,027,971 A | 2/2000 | Cho et al. | |
| 6,160,297 A | * 12/2000 | Shimizu et al. | |
| 6,255,689 B1 | * 7/2001 | Lee | |

FOREIGN PATENT DOCUMENTS

EP 520825 A1 * 12/1992

OTHER PUBLICATIONS

Xilinx, Flash 0.35 um 3V Process Summary, 0.35 um 3V CMOS Embedded FLASH Technology for CPLD Applications, Summary of Electrical and Layout Design Rules.

* cited by examiner

Primary Examiner—Stephen D. Meier
(74) Attorney, Agent, or Firm—Birch, Stewart, Kolasch & Birch, LLP

(57) ABSTRACT

Nonvolatile memory and method for fabricating the same, which can prevent damages to a diffusion region between a selection transistor and a memory cell transistor and reduce a cell size, the nonvolatile memory including a semiconductor substrate having a selection transistor and a cell transistor defined thereon, a line form of a first selection gate line formed on the selection transistor region in one direction and a floating gate formed on the cell transistor region in a fixed pattern, an insulating film and a second gate line formed on the first selection gate line at fixed intervals, and an insulating film and a control gate line over the insulating film including the floating gate in a direction the same with the first gate line, impurity regions formed in one region in the semiconductor substrate on both sides of the control gate line and the first selection gate line, a first planar protection film having first contact holes one each to the first selection gate line and to the impurity region, a contact plug in the first contact hole, a conductive layer pattern in contact with the contact plug, a second planar protection film having a contact hole to the conductive layer pattern over the first selection gate line, and a wiring line formed on the second contact hole and the second planar protection film in one direction.

11 Claims, 17 Drawing Sheets

NONVOLATILE MEMORY AND METHOD FOR FABRICATING THE SAME

This application is a divisional of co-pending Application No. 09/295,447, filed on Apr. 21, 1999, now U.S. Pat. No. 6,255,155 the entire contents of which are hereby incorporated by reference and for which priority is claimed under 35 U.S.C. §120; and this application claims priority of Application No. 14580/1998 and 11612/1999 filed in Korea on Apr. 23, 1998 and Apr. 2, 1999, respectively under 35 U.S.C. §119.

BACKGROUND OF THE INVENTION

1. Field of the Invention

The present invention relates to a nonvolatile memory, and more particularly, to a nonvolatile memory and a method for fabricating the same, which can prevent damage to a diffusion region between a selection transistor and a memory cell transistor and reduce cell size.

2. Background of Related Art

An MOS (Metal On Insulator) memory (which holds information recorded in a cell even after power is cut off) is a nonvolatile memory that has applications in fields of power-on program storage media (for example, built in a computer bios program, various equipment set-up program and the like), operation program memories for vending machine/ticketing machine, font storage media for computer/printer and etc., game machine and the like. In general, nonvolatile memories include MASK ROM, PROM, EPROM, EEPROM and flash EEPROM. An EEPROM (Electrically Erasable and Programmable Read Only Memory) will be explained as an example with respect to the related art and to the present invention.

A related art nonvolatile memory will be explained with reference to the attached drawings. FIG. 1 illustrates a layout of the related art nonvolatile memory. FIG. 2 illustrates a section across line I—I in FIG. 1. FIG. 3 illustrates a section across line II—II in FIG. 1. FIG. 4 illustrates a section across line III—III in FIG. 1.

Referring to FIGS. 1~4, a related art EEPROM cell is provided with a semiconductor substrate 10 having an active region and a field region. The active region has a selection transistor region 'A' and a cell transistor region 'B' defined therein. First and second gate oxide films 12a and 12b are formed in different thicknesses on the selection transistor region 'A' and the cell transistor region 'B' on the semiconductor substrate 10, respectively. A selection gate line 13a is formed on a region of the second gate oxide film 12a in the selection transistor region 'A' in one direction. A floating gate pattern 13b and an insulating film 14 are formed on a region of the second gate oxide film 12b in the cell transistor region 'B' in a direction identical to the direction of the selection gate line 13a at a fixed interval. A control gate 15a is formed on the insulating film 14 in a direction identical to the direction of the floating gate pattern 13b. Impurity diffusion regions 17 of a conductivity type opposite to that of the semiconductor substrate 10 are formed in the semiconductor substrate 10 on both sides of the selection gate line 13a and the floating gate pattern 13b/the control gate line 15a. The impurity diffusion regions 17 are impurity regions used as source and drain regions. A bit line 20 is formed to cross the selection gate line 13a and the control gate line 15a. The unexplained reference numerals 18 and 21 are first and second interlayer insulating films, 19 is a bit line contact hole, 22 is a selection gate contact region and 23 is a common source contact region.

A related art method for fabricating the aforementioned nonvolatile memory will be explained with reference to the attached drawings. FIGS. 5a~5g illustrate sections across line IV—IV in FIG. 1 for showing the steps of a related art method for fabricating a nonvolatile memory.

Referring to FIG. 5a, the related art method for fabricating a nonvolatile memory starts with forming a field insulating film 11 on a field region of a semiconductor substrate 10 having a selection transistor region 'A', a cell transistor region 'B' and the field region defined thereon. Then, a first and a second gate oxide films 12a and 12b with thicknesses different from each other are formed on the selection transistor region 'A' and the cell transistor region 'B'; respectively. The first gate oxide film 12a on the selection transistor region 'A' is thicker than the second gate oxide film 12b on the cell transistor region 'B'. The thin second gate oxide film 12b on the cell transistor region 'B' is a tunneling oxide film. As shown in FIG. 5b, a first polysilicon layer is deposited on an entire surface, and the first polysilicon layer on regions of the first and second gate oxide films 12a and 12b are selectively patterned (photolithography+etching), to form a selection gate line 13a on the selection transistor region 'A' and a floating gate pattern 13b on the cell transistor region 'B'. Then, an insulating film 14 is formed on entire surfaces of the first and second gate oxide films 12a and 12b including the selection gate line 13a and the floating gate pattern 13b. The insulating film 14 has an ONO (Oxide Nitride Oxide) structure. Though not shown in the FIGS. 5a~5g, the floating gate pattern 13b, patterned in a horizontal direction, is separated in rectangular portions. As shown in FIG. 5c, a second polysilicon layer 15 is formed on an entire surface of the insulating film 14. As shown in FIG. 5d, a first photoresist film PRI is coated on the second polysilicon layer 15 and subjected to selective patterning by exposure and development, to remove the first photoresist film PR1 from upper portions of the selection transistor region 'A' and from a part of the cell transistor region 'B' adjacent to the selection transistor region 'A'. The patterned first photoresist film PR1 is used as a mask to remove the second polysilicon layer 15 selectively, to leave the second polysilicon layer 15 only on the insulating film 14 on the cell transistor region 'B'. If the second polysilicon layer 15 is left only on a region on which the control gate line is to be formed for forming the control gate line (because the selection gate line 13a is also etched as the floating gate pattern 13b under the control gate line is etched), only the second polysilicon layer 15 on the selection transistor region 'A' is removed at first. Then, as shown in FIG. 5e, the first photoresist film PR1 is removed, and a second photoresist film PR2 is coated on the second polysilicon layer 15 including the insulating film 14, and subjected to patterning by exposure and development, to leave one portion of the second photoresist film PR2 on an entire surface of the selection transistor region 'A' and the other portion on the second polysilicon layer 15 over the floating gate pattern 13b on the cell transistor region 'B' spaced from the one portion over the selection transistor region 'A'. The patterned second photoresist film PR2 is used as a mask in selectively etching and removing the second polysilicon layer 15 and portions of the floating gate pattern 13b, to form a control gate line 15a. Upon etching the second polysilicon layer 15 and the floating gate pattern 13b of the first polysilicon layer, the part of semiconductor substrate 10 not masked by the second photoresist film PR2 at an interface of the selection transistor region 'A' and the cell transistor region 'B' is also etched to form a trench 16, because of different etch selectivities and etch rates. In general, though an oxide film, a nitride film and a polysilicon layer differ in their respective etch selectivities, the etching time period must be watched carefully because an oxide film and a nitride film are etched to some extents when a polysilicon layer is etched. Under the same etch conditions, an etch rate of the nitride film is higher than the etch rate of the polysilicon layer, and an etch rate of the oxide film is higher than the etch rate of the nitride film. Because of these reasons, when the second polysilicon layer 15 and the floating gate pattern 13b are etched, the ONO-structured insulating film 14, the thin second gate oxide film 12b, and the semiconductor substrate 10 are also etched, forming the unnecessary trench 16. As shown in FIG. 5f, the second photoresist film PR2 is removed, and the selection gate line 13a and the control gate line 15a are used as a mask in conducting an ion injection to form impurity regions 17 in the semiconductor substrate 10 on both sides of the selection gate line 13a and the control gate line 15a. A first interlayer insulating film 18 is deposited on an entire surface of the semiconductor substrate 10 including the selection gate line 13a and the control gate line 15a. A bit line contact region is defined therein, and the first interlayer insulating film 18, the insulating film 14 and the first gate oxide film 12a, all of which are in the bit line contact region, are subjected to selective patterning (photolithography+etching), to form a bit line contact hole 19. Then, a bit line 20 is formed on an entire surface of the first interlayer insulating film 18 including the bit line contact hole 19 and subjected to patterning to a fixed width. As shown in FIG. 5g, a second interlayer insulating film 21 is deposited on the first interlayer insulating film 18 including the bit line 20. In addition to this, a signal application region for the selection gate line 13a is defined at one side of the bit line 20(see FIG. 1), and the first and second interlayer insulating films 18 and 21 over the selection gate line 13a are selectively removed to form a selection gate contact hole 22. And, a common source contact region 23 is formed in an N$^+$ diffusion region in the cell transistor region 'B'.

However, the related art nonvolatile memory and method for fabricating the same have the following problems.

The formation of unneccesary trench in the semiconductor substrate between the selection transitor region and the cell transistor region leads irregularly-shaped impurity regions, which reduces device reliability.

SUMMARY OF THE INVENTION

Accordingly, the present invention is directed to a nonvolatile memory and a method for fabricating the same that substantially obviates one or more of the problems due to limitations and disadvantages of the related art.

An object of the present invention is to provide a nonvolatile memory and a method for fabricating the same which can prevent damage to impurity regions between a selection transistor and a cell transistor and reduce resistance of the selection transistor.

Another object of the present invention is to provide a nonvolatile memory and a method for fabricating the same which can reduce a space between the selection transistor and the cell transistor to reduce cell size.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the nonvolatile memory includes a semiconductor substrate having a selection transistor and a cell transistor defined thereon, a first selection gate line formed on the selection transistor region in one direction and a floating gate formed on the cell transistor region in a fixed pattern, an insulating film and a second gate line formed on the first selection gate line at fixed intervals, and an insulating film and a control gate line over the insulating film including the floating gates in the same direction as the first gate line, impurity regions formed in one region in the semiconductor substrate on both sides of the control gate line and the first selection gate line, a first planar protection film having first contact holes one each exposing the first selection gate line and the impurity region, respectively, a contact plug in the first contact hole, a conductive layer pattern in contact with the contact plug, a second planar protection film having a contact hole to the conductive layer pattern over the first selection gate line, and a wiring line formed on the second contact hole and the second planar protection film in one direction.

In another aspect of the present invention, there is provided a method for fabricating a nonvolatile memory, comprising the steps of (1) forming a gate insulating film on a semiconductor substrate having a selection transistor region and a cell transistor region defined thereon, (2) patterning the first semiconductor layer in line forms in the selection transistor region and to be spaced from one another at fixed intervals in the cell transistor region, (3) depositing an insulating film and a second semiconductor layer on an entire surface of the semiconductor substrate, (4) subjecting the first and second semiconductor layers and the insulating film to etching, so that a line form of a first selection gate line disposed in one direction and a second selection gate line isolated for a distance disposed on the first selection gate line are formed on the selection transistor region, and so that floating gates patterned into fixed forms and a line form of control gate line disposed on the insulating film including the floating gates are formed in one direction, (5) forming impurity regions in one region in the semiconductor substrate on both sides of the first selection gate line and the control gate line, (6) forming a first planar protection film having first contact holes one each to the first selection gate line and to the impurity region on one side of the gate line, (7) forming a contact plug in each of the first contact holes, (8) forming a conductive layer pattern on the contact plugs and the first planar protection film, (9) forming a second planar protection film having a second contact hole to the contact plug on the first selection gate line, and (10) forming a conductive line in one direction both on the second contact hole and the second planar protection film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
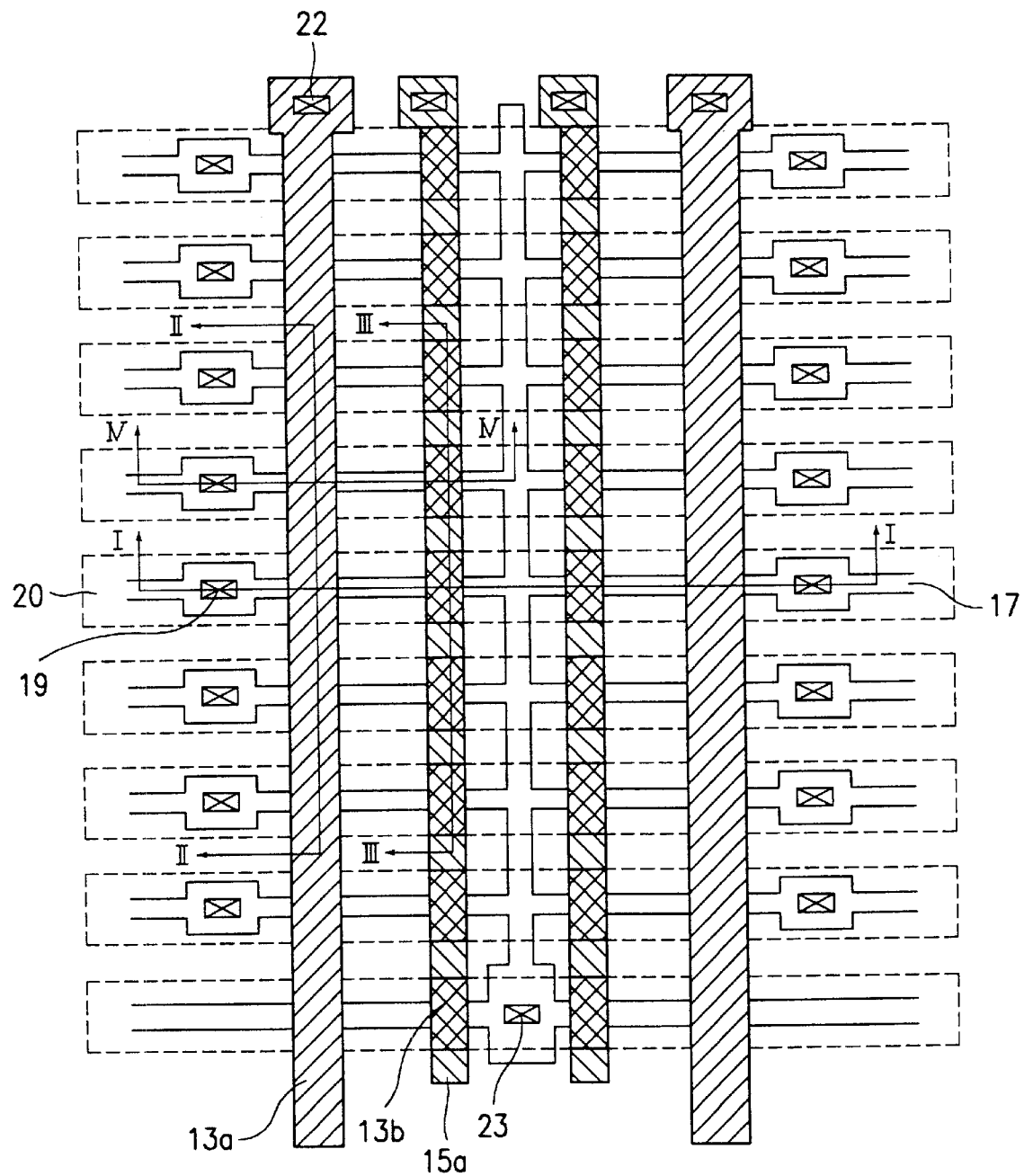
FIG. 1 illustrates a layout of a related art nonvolatile memory.
Figure 2:
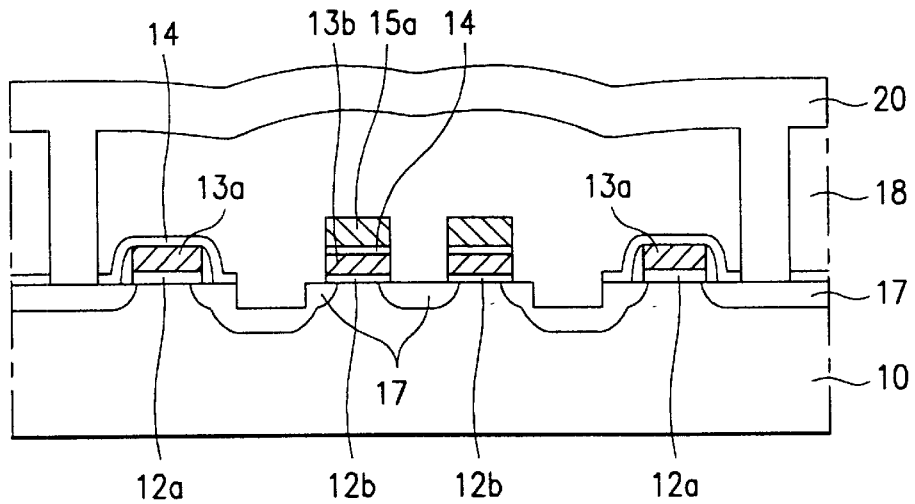
FIG. 2 illustrates a section across line I—I in FIG. 1.
Figure 3:
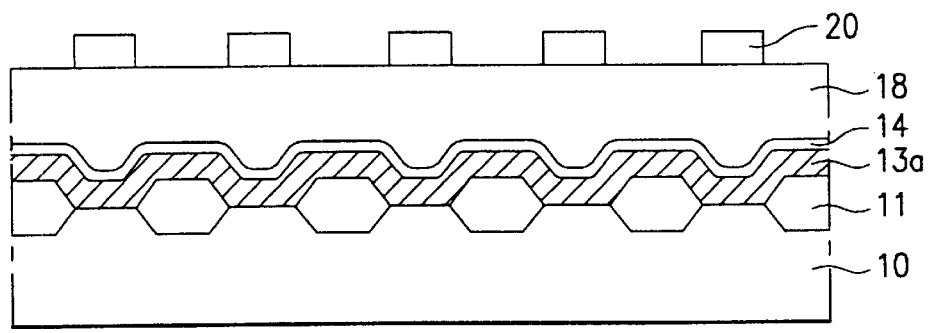
FIG. 3 illustrates a section across line II—II in FIG. 1.
Figure 4:
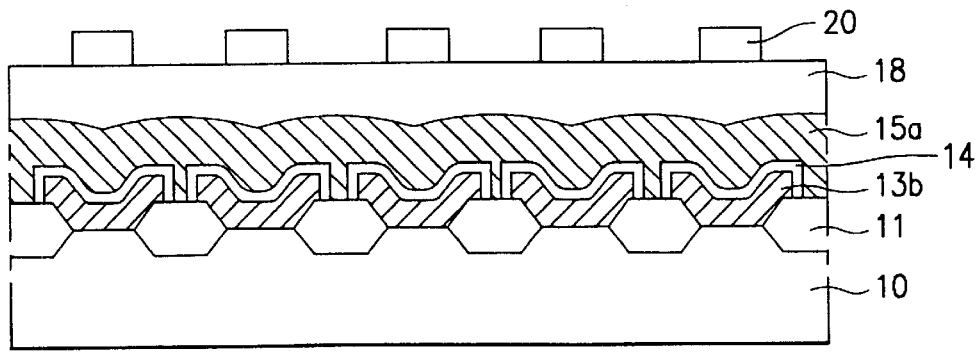
FIG. 4 illustrates a section across line III—III in FIG. 1.
Figure 5A:
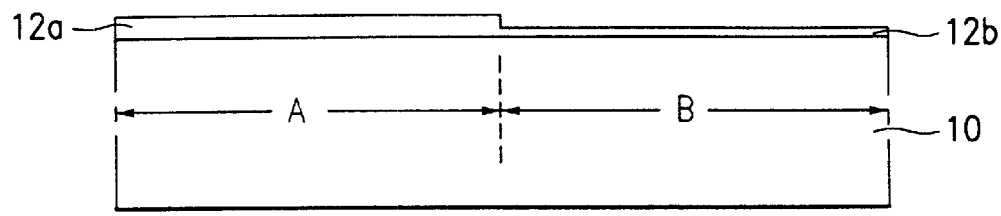
FIGS. 5a~5g illustrate sections across line IV—IV in FIG. 1 for showing the steps of a related art method for fabricating a nonvolatile memory.
Figure 5B:
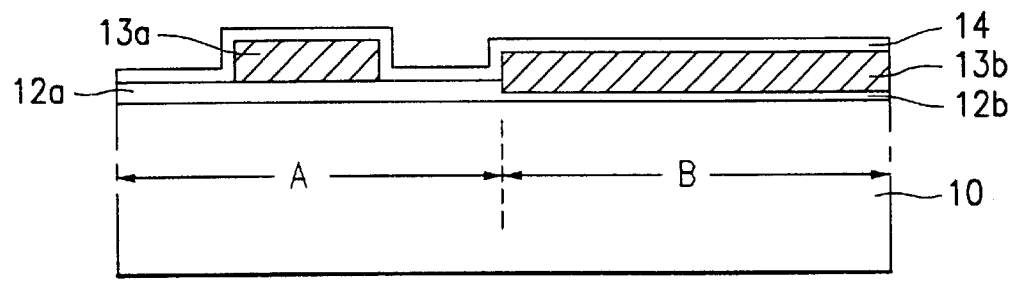
Figure 5C:
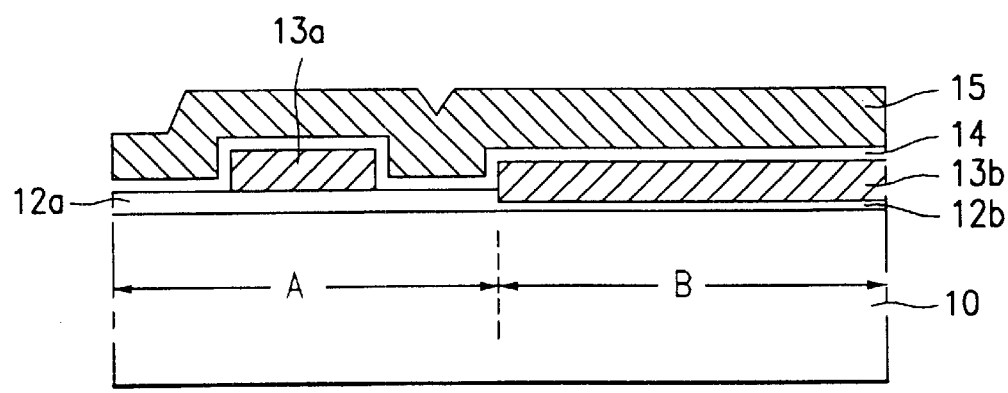
Figure 5D:
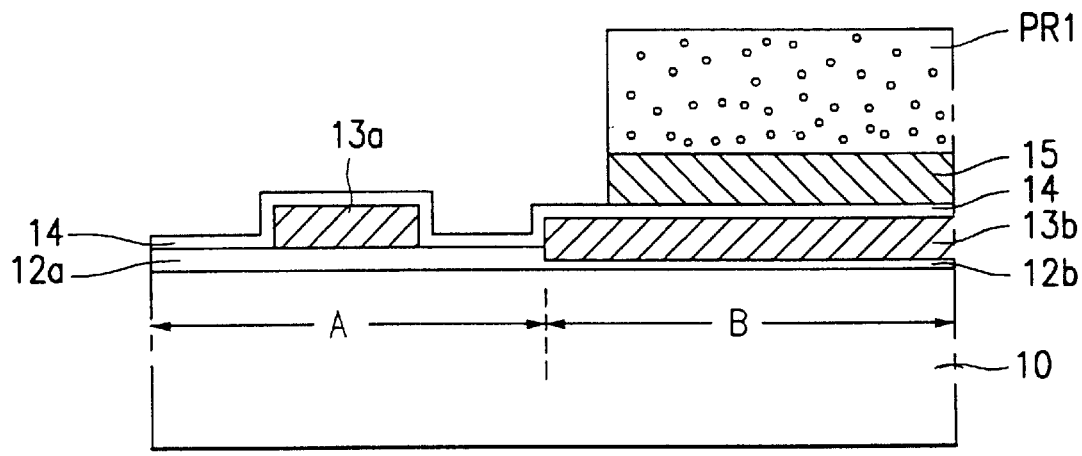
Figure 5E:
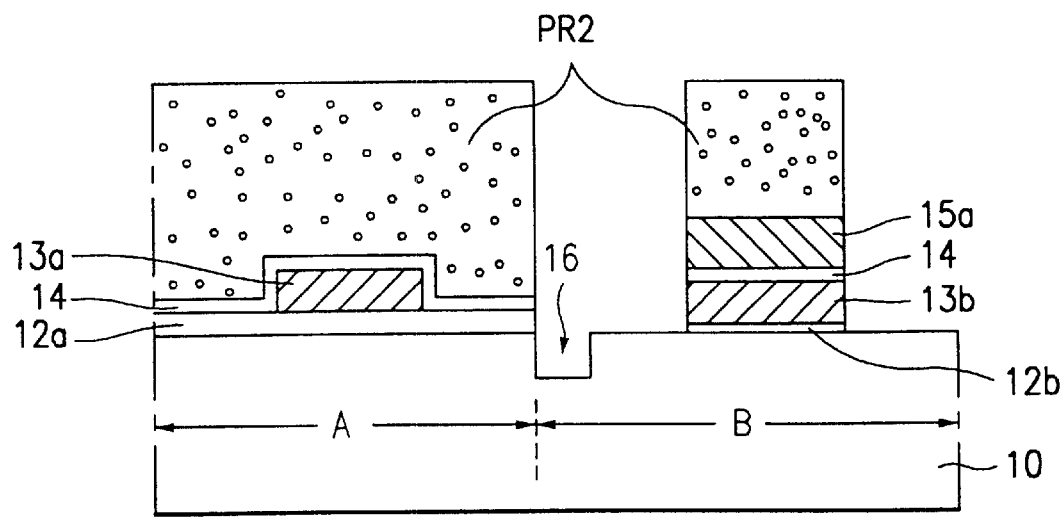
Figure 5F:
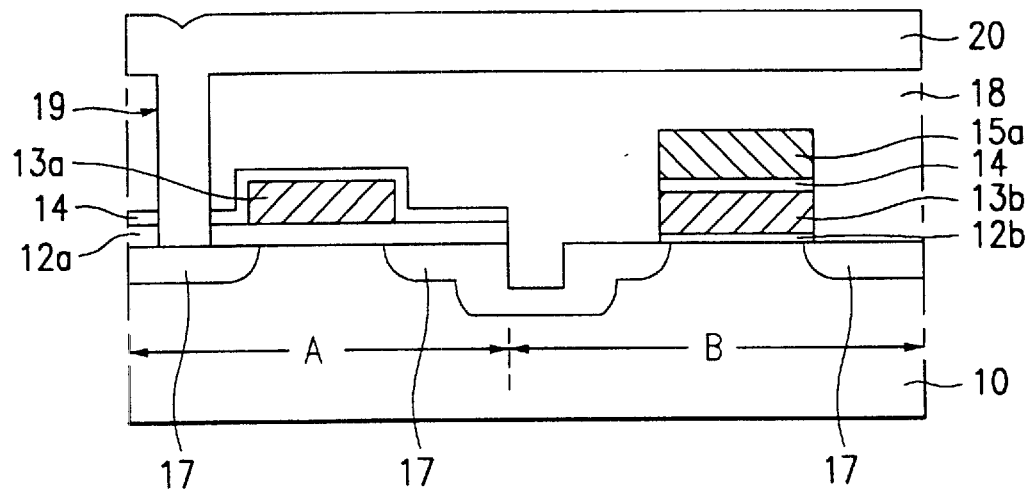
Figure 5G:
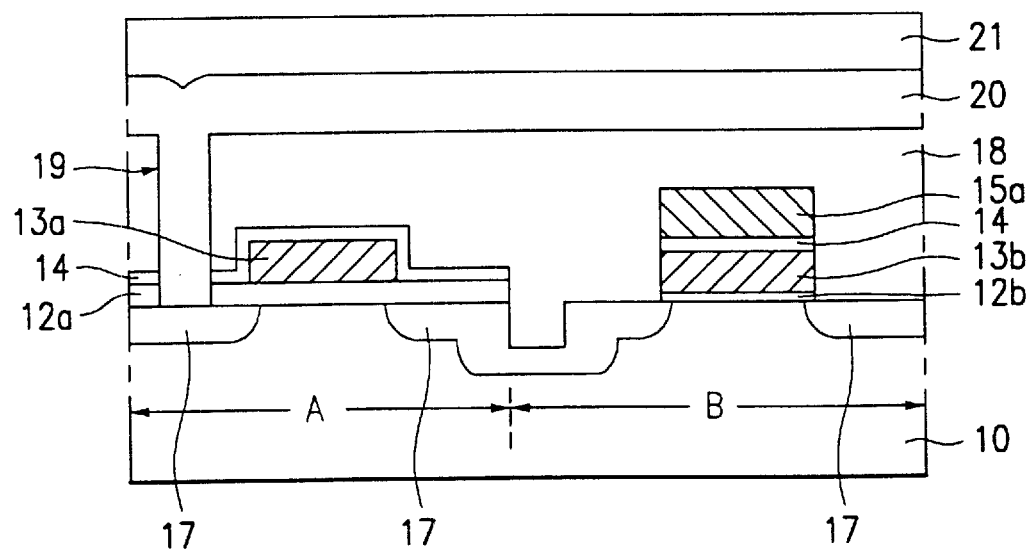
Figure 6:
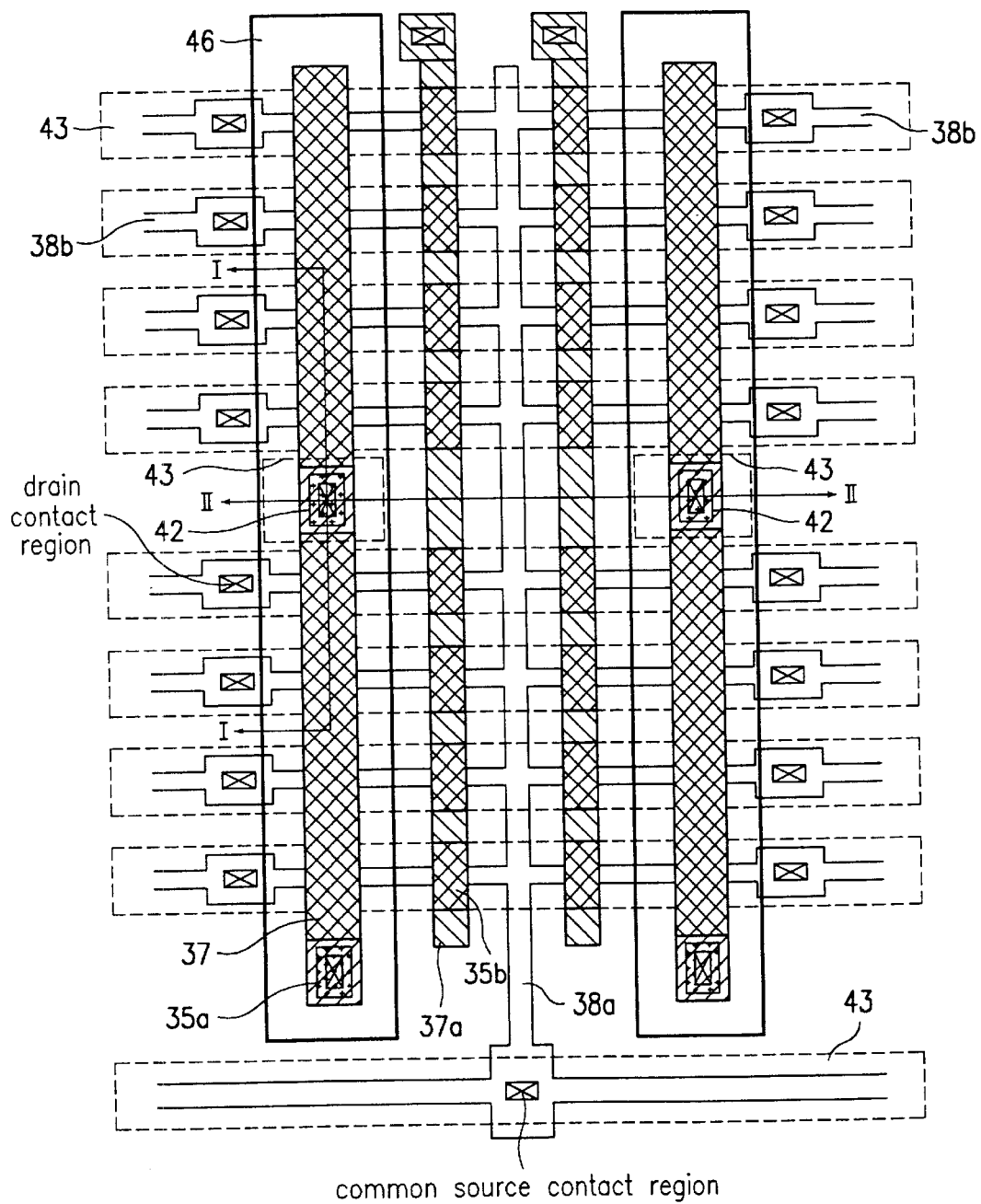
FIG. 6 illustrates a layout of a nonvolatile memory in accordance with a first preferred embodiment of the present invention.

Reference will now be made in detail to the preferred embodiments of the present invention, examples of which are illustrated in the accompanying drawings. FIG. 6 illustrates a layout of a nonvolatile memory in accordance with a first preferred embodiment of the present invention, FIG. 7 illustrates a section across line I—I in FIG. 6, and FIG. 8 illustrates a section across line II—II in FIG. 6.

In the first preferred embodiment nonvolatile memory of the present invention, a selection transistor and a cell transistor are similarly formed, such that the selection transistor has a stacked first polysilicon layer and second polysilicon layer like the cell transistor, with the first polysilicon layer adapted to have a voltage applied thereto. In order to prevent an increase in resistance of the second polysilicon layer formed over a selection gate line, the second polysilicon layer is spaced therefrom. Wiring is formed such that the wiring contacts a selection gate line of the first polysilicon layer under the spaced region of the second polysilicon layer.

Figure 7:
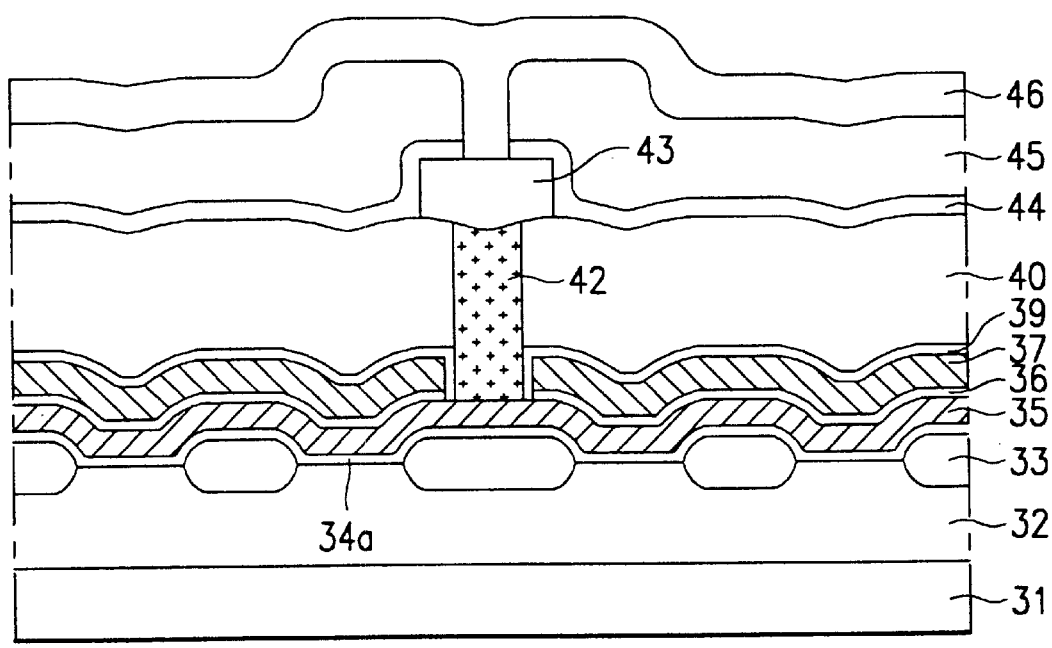
FIG. 7 illustrates a section across line I—I in FIG. 6.
Figure 8:
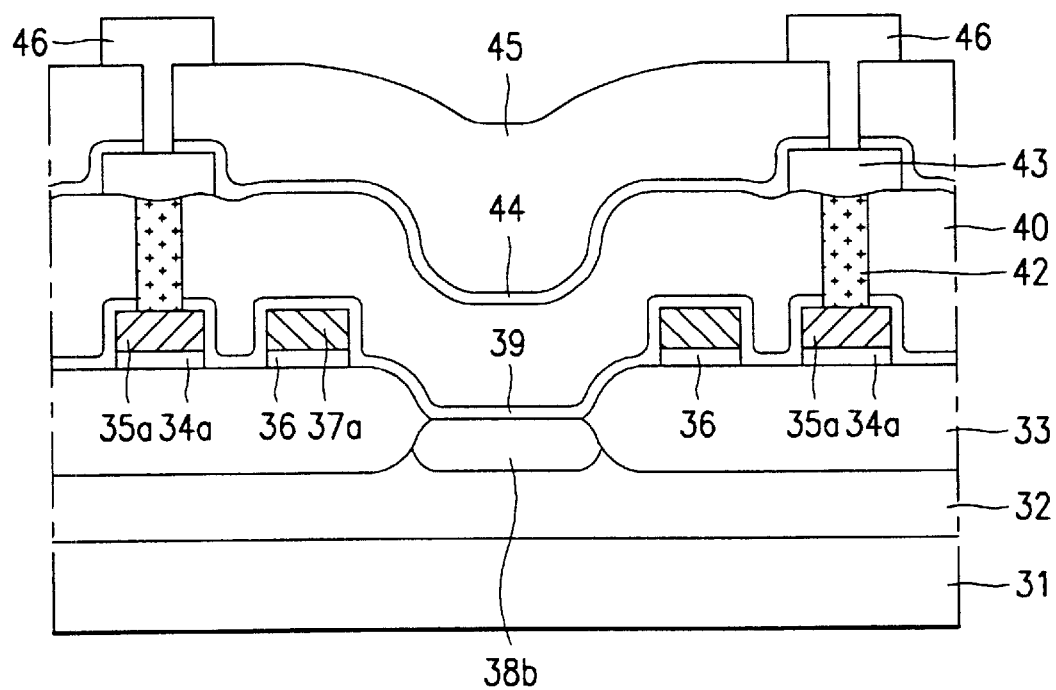
FIG. 8 illustrates a section across line II—II in FIG. 6.

That is, referring to FIGS. 6~8, the nonvolatile memory of the first preferred embodiment includes a field oxide film 33 on a field region of an N-type semiconductor substrate 31 having an active region and a field region defined thereon. The semiconductor substrate 31 has a P-well 32 to a certain depth. The semiconductor substrate 31 has a selection transistor region and a cell transistor region defined thereon. The selection transistor region has a selection gate line 35a extending in one direction, and there is a first gate oxide film 34a under the selection gate line 35a. A second polysilicon layer 37 is formed over and spaced from the selection gate line 35a. An insulating film 36 is formed beneath the second polysilicon layer 37. The insulating film 36 has an ONO structure. The cell transistor region has floating gates 35b on a region thereof patterned into rectangular portions, and a second gate oxide film 34b under the floating gate 35b. The second gate oxide film 34b is thicker than the first gate oxide film 34a. There is a control gate line 37a formed on the insulating film 36 including the floating gate 35b in the same direction with the selection gate line 35a. The insulating film 36 beneath the control gate line 37a has an ONO structure. There are a plurality of source regions 38a and drain regions 38b in the active region of the semiconductor substrate 31 on both sides of the control gate line 37a and the selection gate line 35a in the same direction as the selection gate line 35a. A first interlayer insulating film 39 and a first planar protection film 40 having a first contact hole 41 are stacked. First, contact hole 41 exposes selection gate line 35a through second polysilicon layer 37 and selection protection film 40. The first interlayer insulating film 39 is formed to cover exposed sides of the second polysilicon layer 37 in the first contact hole 41. Tungsten plugs 42 are selectively formed in the first contact holes 41. There is a rectangular metal pattern 43 on both the tungsten plug 42 formed in the isolated region of the second polysilicon layer 37 and the adjoining first planar protection film 40. There is a metal line pattern 43 in contact with the tungsten plug 42 formed in the drain region 38b over the stack of the floating gate 35b and the control gate line 37a in a direction crossing the control gate line 37a. The tungsten plug 42 in the drain region 38b is used as the bit line. The source region 38a of the cell transistor extends between the cell transistors as well as along one side of the semiconductor substrate 31, and there is a metal contact 43 connected to the cell transistors in common through a common source contact region in the extended source region 38a. The metal contact 43 connected to the common source contact region is a line in a direction perpendicular to the control gate line 37a. There is a stack of a second interlayer insulating film 44 and the second planar protection film 45 having a second contact hole to expose the metal pattern 43 over the selection gate line 35a. A metal line 46 is formed on the second planar protection film 45 in contact with the metal pattern 43 through the second contact hole in the same direction as the selection gate line 35a.

A method for fabricating a nonvolatile memory in accordance with a first preferred embodiment of the present invention will be explained with reference to the attached drawings. FIGS. 9a~9d illustrate sections across line I—I in FIG. 6 for showing the steps of a method for fabricating a nonvolatile memory, and FIGS. 10a~10c illustrate sections across line II—II in FIG. 6 for showing the steps of a method for fabricating a nonvolatile memory.

Figure 9A:
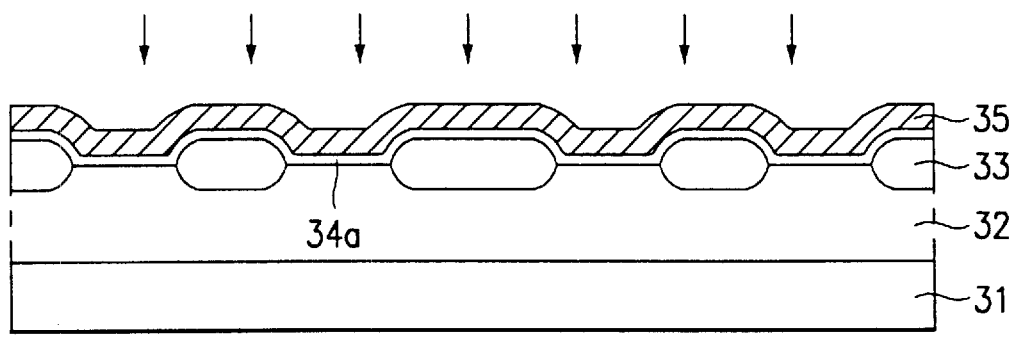
FIGS. 9a~9d illustrate sections across line I—I in FIG. 6 for showing the steps of a method for fabricating a nonvolatile memory.
Figure 9B:
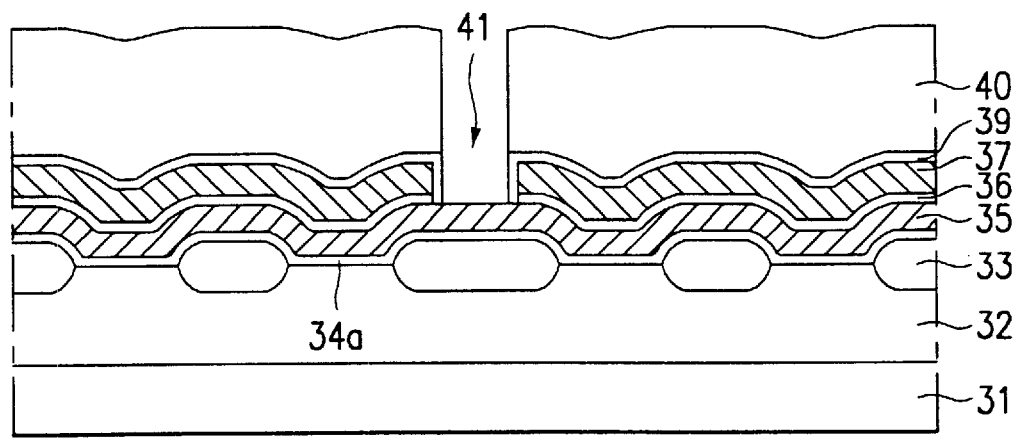
Figure 9C:
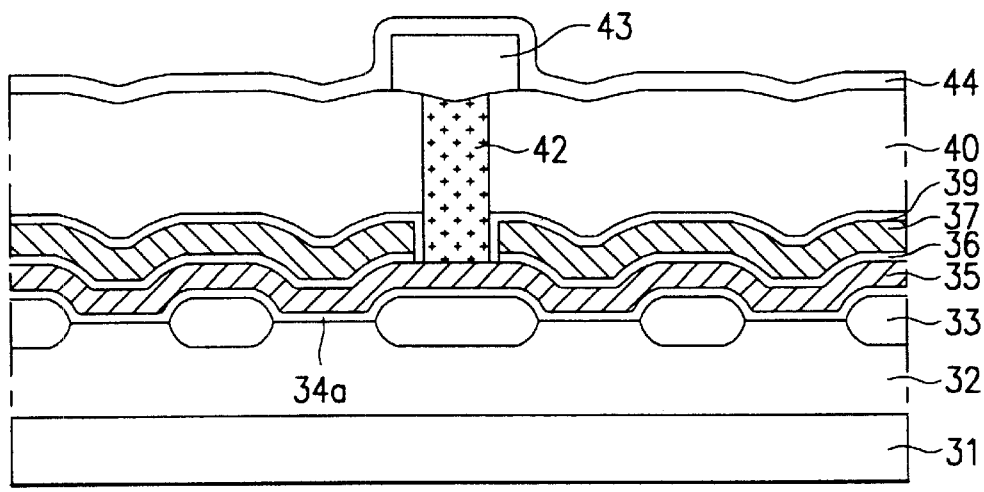
Figure 9D:
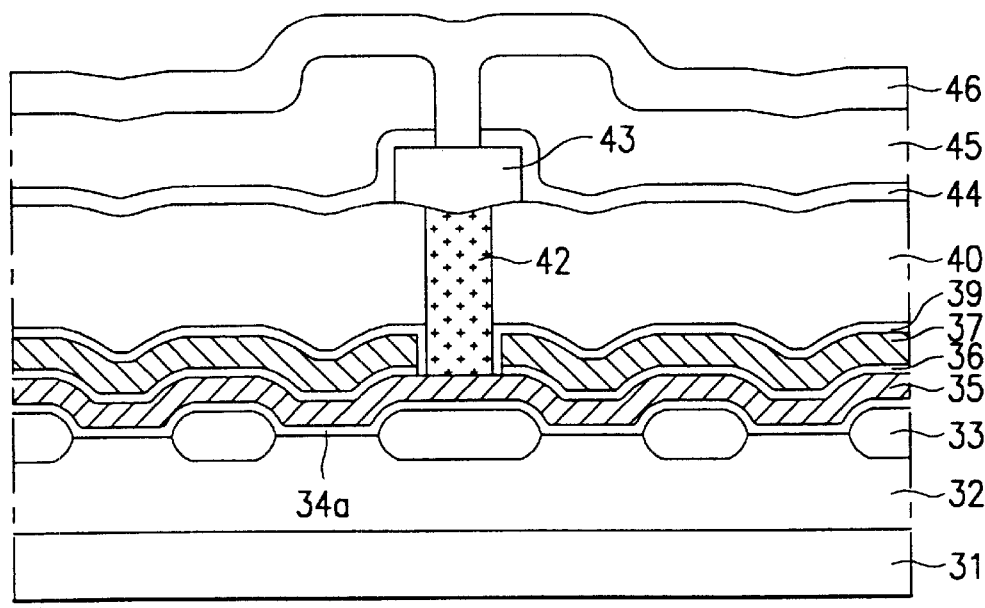
Figure 10A:
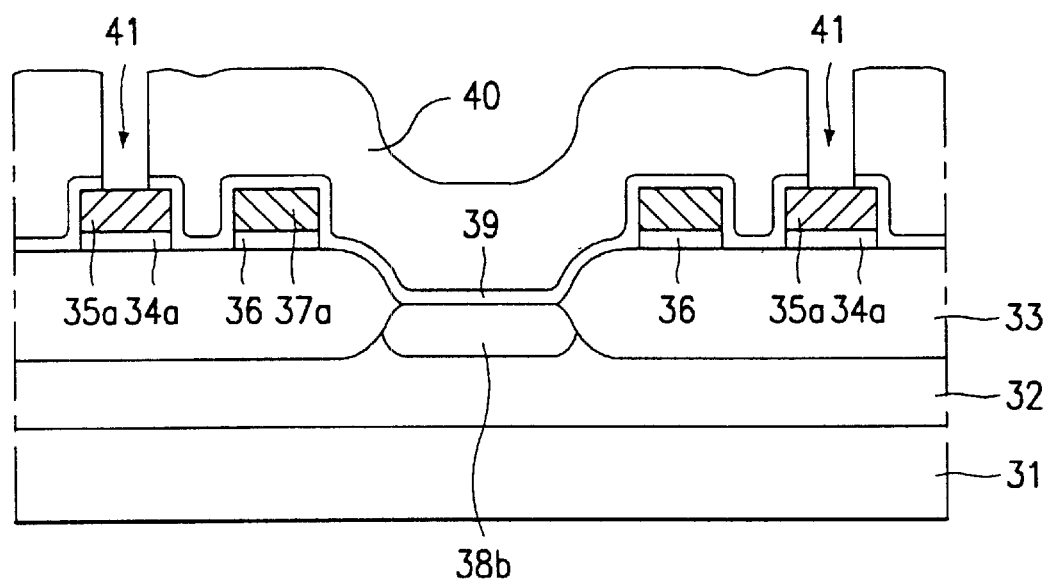
FIGS. 10a~10c illustrate sections across line II—II in FIG. 6 for showing the steps of a method for fabricating a nonvolatile memory.
Figure 10B:
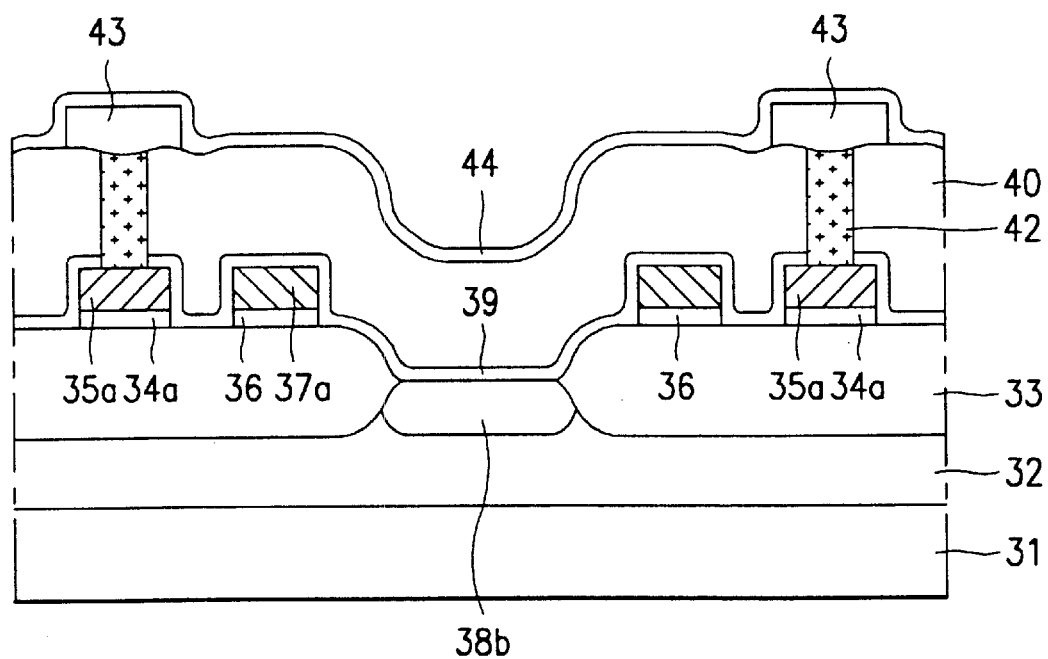
Figure 10C:
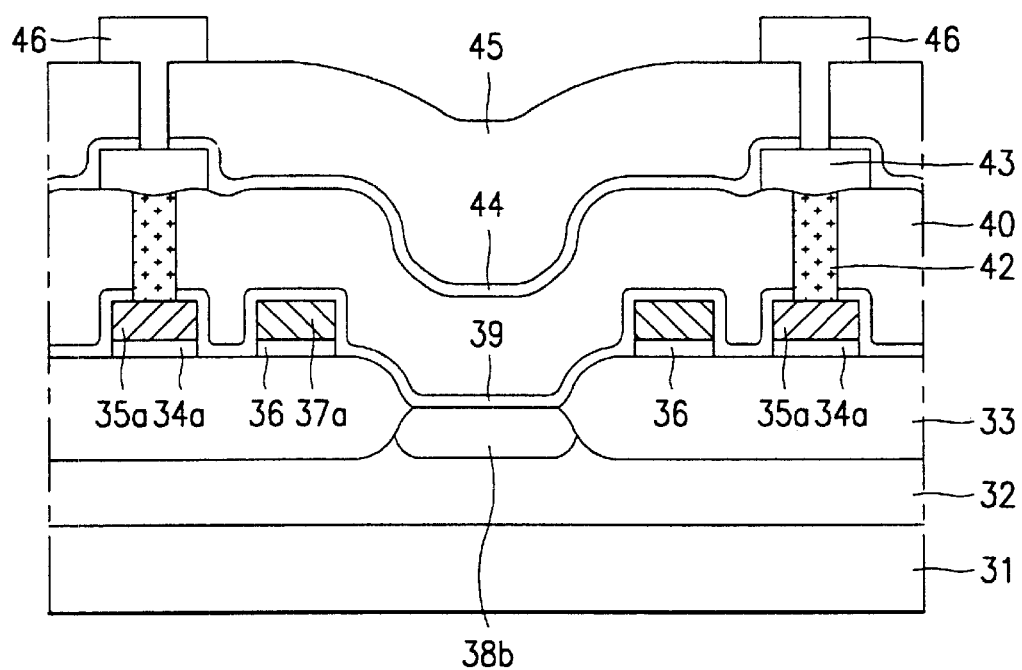

Referring to FIGS. 9a and 10a, the method for fabricating a nonvolatile memory in accordance with a first preferred embodiment of the present invention starts with forming a P well 32 to a certain depth in an N-type semiconductor substrate 31 having an active region and a field region defined thereon. A field oxide film 33 is formed on the field region by LOCOS (LOCal Oxidation of Silicon). The semiconductor substrate 31 is demarcated into a selection transistor region and a cell transistor region (not shown in the drawings). Ions are injected into a surface of the P well 32 to adjust a threshold voltage. An oxide film is deposited on the selection transistor region and the cell transistor region, and the oxide film on the cell transistor region is partly removed, so that a thickness of a first gate oxide film 34a on the selection transistor region is thicker than the second gate oxide film 34b on the cell transistor region. An undoped first polysilicon layer 35 is deposited on an entire surface of the substrate including the first and second gate oxide films 34a and 34b. Impurity ions are injected into the undoped first polysilicon layer 35 to dope the first polysilicon layer 35 as seen in FIG. 9a. As shown in FIGS. 9b and 10a, the doped first polysilicon layer 35 is patterned such that the selection transistor region and the cell transistor region are connected, wherein the selection transistor region is patterned to be elongated in a horizontal direction and the cell transistor region is patterned to be spaced at fixed intervals to one another for later forming a rectangular floating gate pattern. An insulating film 36 of ONO structure is deposited on an entire surface of the structure, and a doped second polysilicon layer 37 is deposited on an entire surface of a resultant body. Then, the first and second polysilicon layers 35 and 37 on the selection transistor region and the cell transistor region are subjected to anisotropic etching at the same time, to stack the first and second polysilicon layer 35 and 37. According to this, a selection gate line 35a of the first polysilicon layer 35 is formed on the selection transistor region, and a second polysilicon layer 37 is formed on the selection gate line 35a to be spaced at fixed intervals to one another. A floating gate 35b of rectangular form patterned to be spaced at fixed intervals to one another is formed on the cell transistor region, and a control gate line 37a is formed on the insulating film 36 including the floating gate 35b. The control gate line 37a is parallel to and in a direction the same with the selection gate line 35a. Then, impurity ions are injected into surfaces of the P well 32 on both sides of the selection gate line 35a control gate line 37a, to form a source region 38a and a drain region 38b such that a plurality of the source regions 38a and the drain regions 38b is provided in one direction in an array of cells. The source regions 38a extend between the cell transistors as well as along one side of the semiconductor substrate 31. The source regions 38a and the drain regions 38b may be formed by injecting impurity ions into the P well 32 on both sides of the selection gate line 35a and the control gate line 37a after light injection of impurity ions into surfaces of the P well 32 on both sides of the selection gate line 35a and the control gate 37a and formation of sidewall spacers (not shown) at both sides of the selection line 35a and the floating gate 35b/ control gate line 37a. Then, a first interlayer insulating film 39 and a first planar protection film 40 are deposited in succession on an entire surface of a resultant body. First contact holes 41 are formed to expose a top portion of the selection gate line 35a at an isolated portion of the second polysilicon 37, the drain region 38b, and one side of the extended source region 38a, respectively, to form a drain contact region in each of the drain regions 38b and a common source contact region in the source region 38a (see FIG. 6). Next, as shown in FIGS. 9c and 10b, after a tungsten plug 42 is formed in the first contact hole 41, a first metal layer is deposited on an entire surface including the tungsten plug 42. The metal layer is formed by sputtering aluminum. Then, the first metal layer is selectively etched to form a metal pattern 43. In view of cell array, each of the metal patterns 43 are formed to have a pattern of rectangular forms on the tungsten plug 42 formed in the isolated region of the second polysilicon layer 37 and the adjoining first planar protection film 40, over the control gate line 37a over the floating gate 35b to be connected to the tungsten plug 42 in the drain region 38b in a direction perpendicular to the control gate line 37a, and to be connected to the tungsten plug 42 in the common source contact region in a direction to cross the control gate line 37a. Then, a second interlayer insulating film 44 is deposited on an entire surface. As shown in FIG. 9d and 10c, a second planar protection film 45 is deposited on the second interlayer insulating film 44. The second interlayer insulating film 44 and the second planar protection film 45 are subjected to anisotropic etching to form a second contact hole to expose the metal pattern 43. A second metal layer is deposited on the second planar protection film 45 and in the second contact hole. Thereafter, the second metal layer is anistropically etched so that the second metal layer contacts the metal pattern 43 through the second contact hole and formed in a direction the same with the selection gate line 35a, to form a metal line 46.

Figure 11:
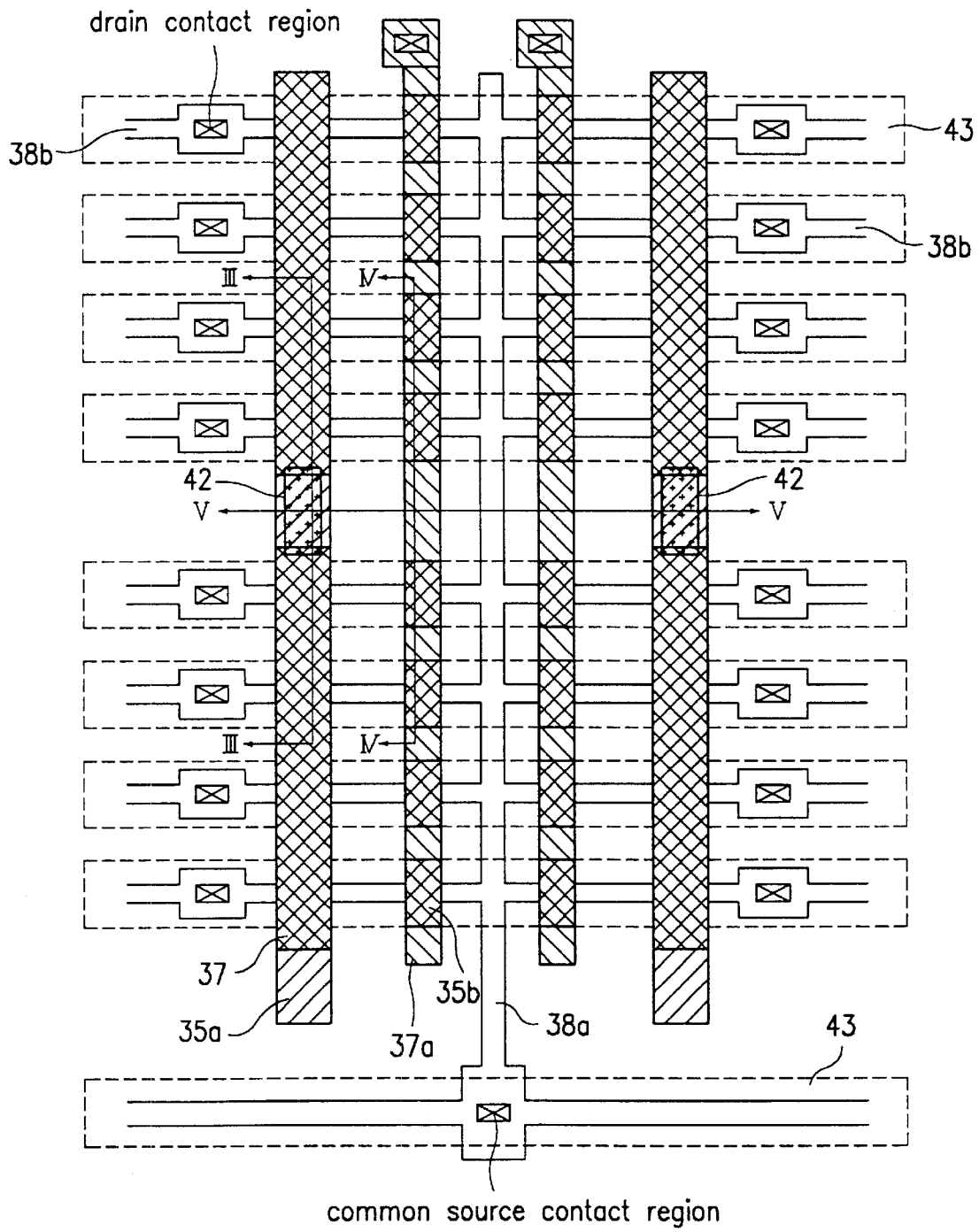
FIG. 11 illustrates a layout of a nonvolatile memory in accordance with a second preferred embodiment of the present invention.
Figure 12:
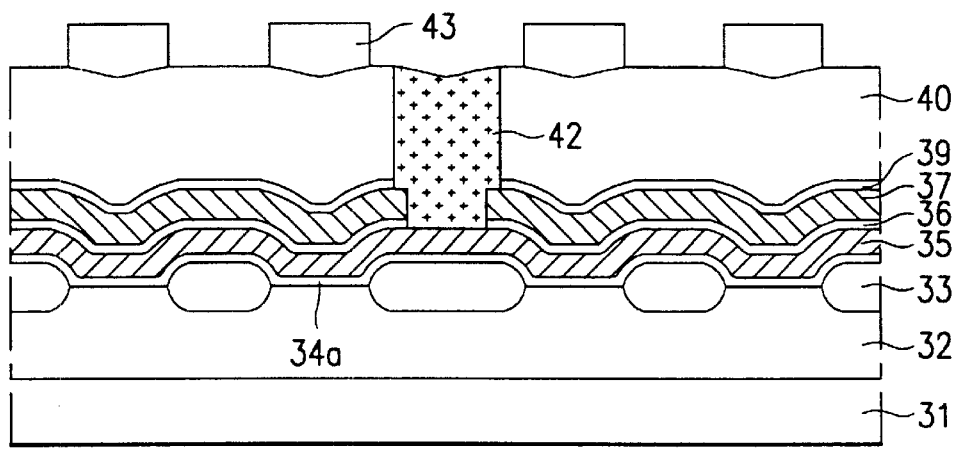
FIG. 12 illustrates a section across line III—III in FIG. 11.
Figure 13:
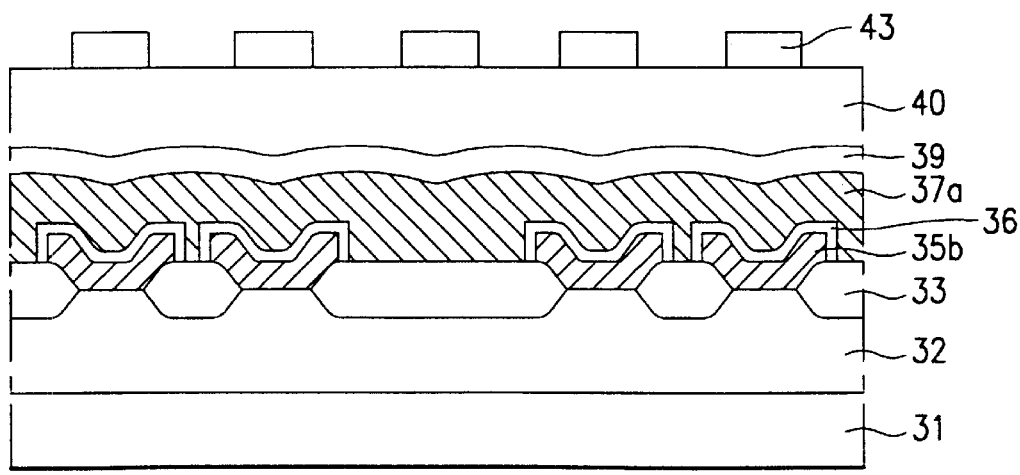
FIG. 13 illustrates a section across line IV—IV in FIG. 11.
Figure 14:
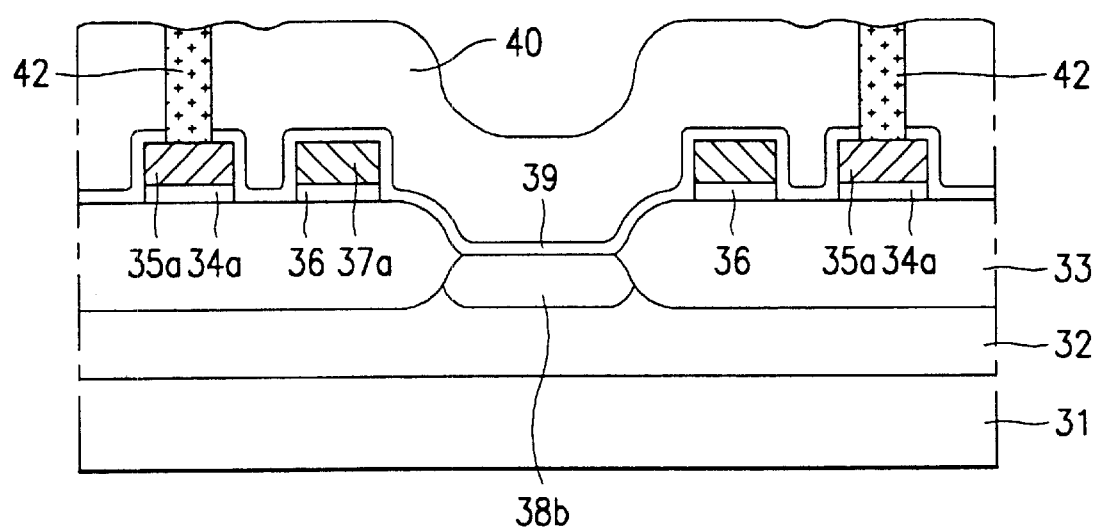
FIG. 14 illustrates a section across line V—V in FIG. 11.

A nonvolatile memory in accordance with a second preferred embodiment of the present invention will be explained with reference to the attached drawings. FIG. 11 illustrates a layout of a nonvolatile memory in accordance with a second preferred embodiment of the present invention, FIG. 12 illustrates a section across line III—III in FIG. 11, FIG. 13 illustrates a section across line IV—IV in FIG. 11, and FIG. 14 illustrates a section across line V—V in FIG. 11.

The nonvolatile memory in accordance with a second preferred embodiment of the present invention includes a selection transistor and a cell transistor, wherein, identical to the cell transistor, the selection transistor includes stacked first and second polysilicon layers, of which the second polysilicon layer is isolated from other ones in the cell array to prevent increasing resistance of the second polysilicon layer on the selection gate line. In addition, in order to reduce a resistance of the selection gate line of the first polysilicon layer, another wiring line is not formed, but the tungsten plug is connected to the low resistance second polysilicon layer. In further detail, as shown in FIGS. 11, 12, 13 and 14, the nonvolatile memory in accordance with a second preferred embodiment of the present invention includes a field oxide film 33 in a field region of a semiconductor substrate 31 having an active region and the field region defined thereon. The semiconductor substrate 31 has a P well 32 formed to a certain depth. The semiconductor substrate 31 has a selection transistor region and a cell transistor region defined thereon. The selection transistor region has a selection gate line 35a in one direction, and there is a first gate oxide film 34a under the selection gate line 35a. There is a second polysilicon layer 37 formed over the selection gate line 35a. There is an insulating film 36 between the second polysilicon layer 37 and selection gate line 35a. The insulating film 36 has an ONO structure. The cell transistor region has floating gates 35b patterned in a rectangular form, and a second gate oxide film 34b provided under the floating gates 35b. The second gate oxide film 34b is thicker than the first gate oxide film 34a. There is a control gate line 37a formed over the insulating film 36 including the floating gate 35b, in the same direction with the selection gate line 35a. The insulating film 36 beneath the control gate line 37a has an ONO structure. There are a plurality of source regions 38a and drain regions 38b in the active region of the semiconductor substrate 31 on both sides of the control gate line 37a and the selection gate line 35a, in the same direction with the selection gate line 35a. And, there are a stack of a first interlayer insulating film 39 and a first planar protection film 40 having a first contact hole 41 exposing isolated portions of the second polysilicon layer 37, the selection gate line 35a and the drain region 38b on the cell transistor region. In this instance, sides of the second polysilicon layer 37 are exposed by the first contact hole 41. There are tungsten plugs 42 selectively formed in the first contact holes 41. There is a metal pattern 43 in contact with the tungsten plug 42 formed in the drain region 38b over the stack of the floating gate 35b and the control gate line 37a in a direction perpendicular to the control gate line 37a. The tungsten plug 42 in the drain region 38b is used as the bit line. The source region 38a of the cell transistor extends along one side of the semiconductor substrate 31, and there is a metal contact 43 connected to the cell transistors in common through a common source contact region in the extended source region 38a. The metal contact 43 connected to the common source contact region is a line formed in a direction perpendicular to the control gate line 37a. The selection gate line 35a has a resistance of approx. 1000Ω. The second polysilicon layer 37 deposited as doped has a resistance of approx. 6Ω or 7Ω. Therefore, as the selection gate line 35a and the second polysilicon layer 37 is connected by the tungsten plug 42 on the selection gate line 35a, a resistance of the selection gate line 35a can be reduced.

Figure 15A:
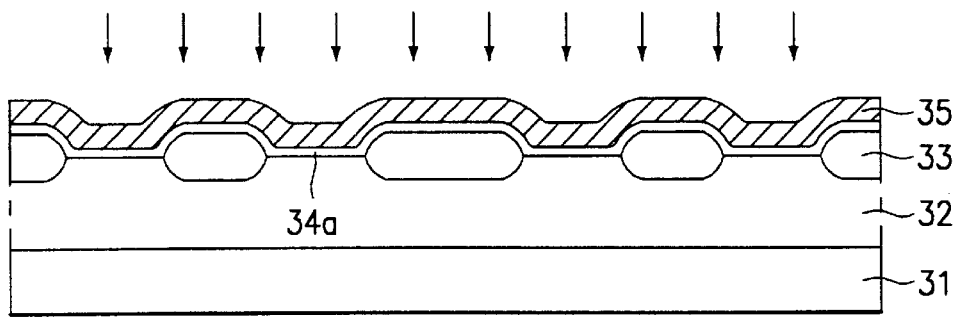
FIGS. 15a~15c illustrate sections across line III—III in FIG. 11 for showing the steps of a method of fabricating a nonvolatile memory; and, FIGS. 16a~16b illustrate sections across line V—V in FIG. 11 for showing the steps of a method for fabricating a nonvolatile memory.
Figure 15B:
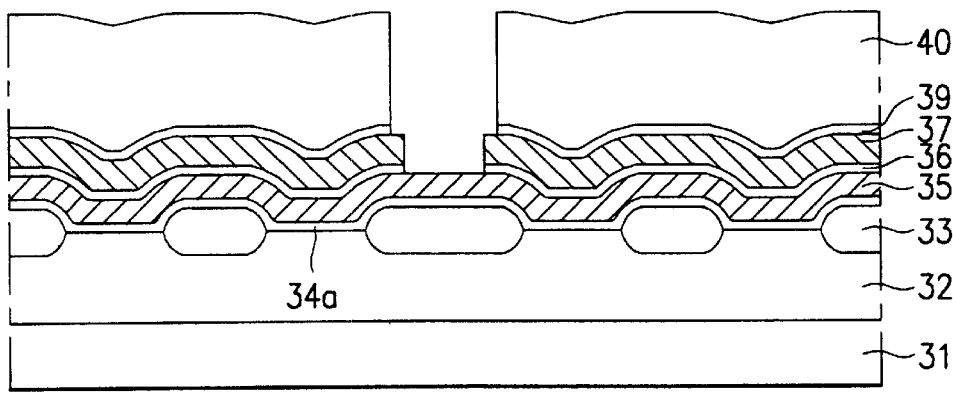
Figure 15C:
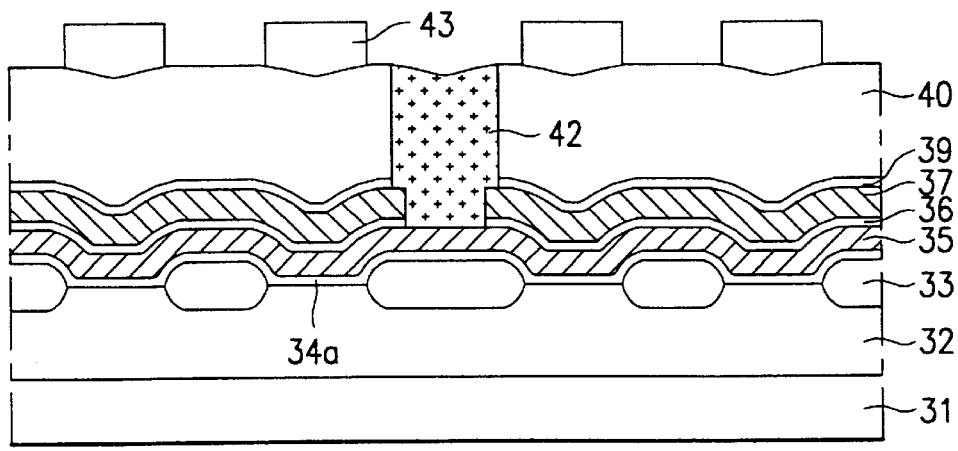

A method for fabricating a nonvolatile memory in accordance with a second preferred embodiment of the present invention will be explained with reference to the attached drawings. FIGS. 15a~15c illustrate sections across line III—III in FIG. 11 for showing the steps of a method for fabricating a nonvolatile memory, and FIGS. 16a~16b illustrate sections across line V—V in FIG. 11 for showing the steps of a method for fabricating a nonvolatile memory.

Figure 16A:
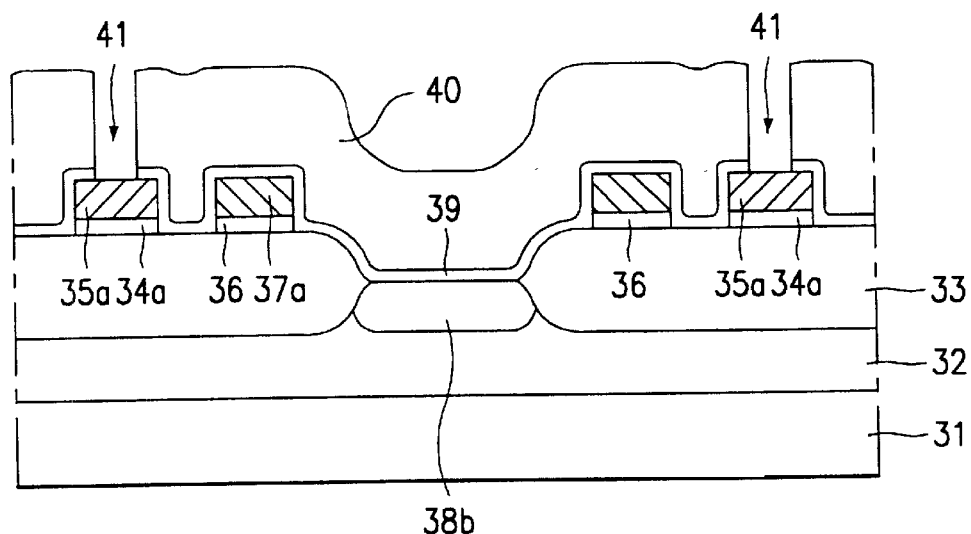
Figure 16B:
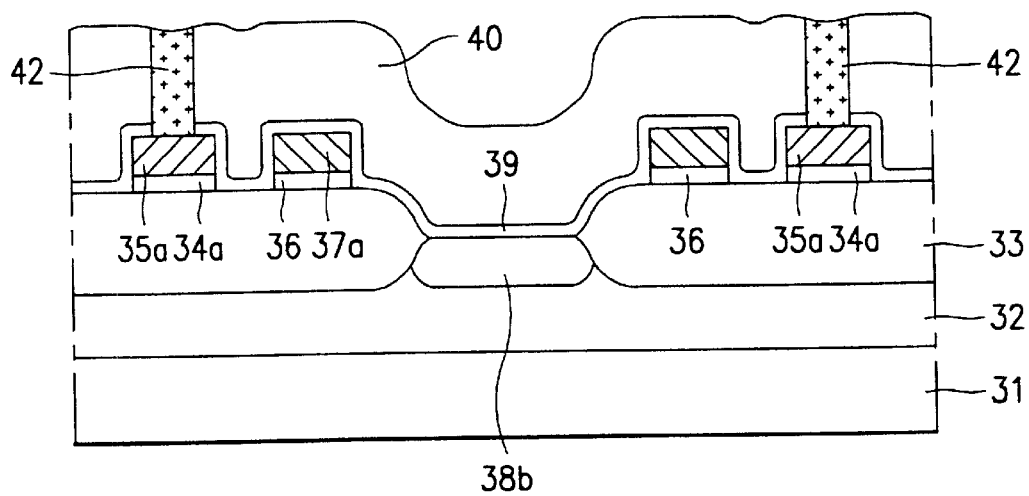

Referring to FIGS. 15a and 16a, the method for fabricating a nonvolatile memory in accordance with a second preferred embodiment of the present invention starts with forming a P well 32 to a certain depth in an N-type semiconductor substrate 31 having an active region and a field region defined thereon. Then, a field oxide film 33 is formed on the field region by LOCOS (LOCal Oxidation of Silicon). The active region is demarcated into a selection transistor region and a cell transistor region (not shown in the drawings). Ions are injected into a surface of the P well 32 for adjusting a threshold voltage. An oxide film is deposited on the selection transistor region and the cell transistor region, and the oxide film on the cell transistor region is partly removed, so that a thickness of a first gate oxide film 34a on the selection transistor region is thicker than the second gate oxide film 34b on the cell transistor region. An undoped first polysilicon layer 35 is deposited on an entire surface including over the first and second gate oxide films 34a and 34b. Impurity ions are injected into the undoped first polysilicon layer 35 to dope the first polysilicon layer 35. As shown in FIGS. 15b and 16a, the doped first polysilicon layer 35 is patterned so that the selection transistor region and the cell transistor region are connected, wherein the selection transistor region is patterned to be elongated in a horizontal direction and the cell transistor region is patterned to leave a floating gate region to be patterned into a rectangular form, later. An insulating film 36 having an ONO structure is deposited on an entire surface, and a doped second polysilicon layer 37 is deposited on an entire surface of a resultant body. Then, the first and second polysilicon layers 35 and 37 on the selection transistor region and the cell transistor region are subjected to anisotropic etching at the same time, to form a stack the first and second polysilicon layer 35 and 37. According to this, a selection gate line 35a of the first polysilicon layer 35 is formed on the selection transistor region, and a second polysilicon layer 37 is formed on the selection gate line 35a to be spaced at fixed intervals to one another. A floating gate 35b patterned to be spaced at fixed intervals to one another is formed on the cell transistor region, and a control gate line 37a is formed on the insulating film 36 including the floating gate 35b parallel to and in a direction the same with the selection gate line 35a. Then, impurity ions are injected into surfaces of the P well 32 on both sides of the selection gate line 35a/control gate line 37a, to form a source region 38a and a drain region 38b such that a plurality of the source regions 38a and the drain regions 38b are provided in one direction in an array of cells. The source region 38a is extended between the cell transistors as well as along one side of the semiconductor substrate 31. The source region 38a and the drain region 38b may be formed by injecting impurity ions into the P well 32 on both sides of the selection gate line 35a and the control gate line 37a after light injection of impurity ions into surfaces of the P well 32 on both sides of the selection gate line 35a and the control gate 37a, and formation of sidewall spacers (not shown) at both sides of the selection line 35a and the floating gate 35b control gate line 37a. Then, a first interlayer insulating film 39 and a first planar protection film 40 are deposited in succession on an entire surface of a resultant body. A first contact hole 41 is formed to expose a portion of the selection gate line 35a in an isolated portion of the second polysilicon 37 and sides of the second polysilicon layer 37. The first contact hole 41 is formed in the drain region 38b and in the extended portion of the source region 38a. In this instance, the first contact holes 41 may be formed such that edges of the isolated portion of the second polysilicon layer 37 are exposed. That is, the first contact hole 41 may be formed such that a diameter of the first contact hole 41 in the first planar protection film 40 is greater than a diameter of the first contact hole 41 in the second polysilicon layer 37. Accordingly, a drain contact region is formed in each of the drain regions 38b and a common source contact region is formed in the source region 38a (see FIG. 11). Next, as shown in FIGS. 15c and 16b, a tungsten plug 42 is selectively formed in each of the first contact holes 41. Then, a first metal layer is deposited on an entire surface including the tungsten plug 42. The metal layer is formed by sputtering aluminum. Then, the first metal layer is anisotropically etched, to form a metal pattern 43. In view of cell array, each of the metal patterns 43 are formed on the control gate line 37a over the floating gate 35b to be connected to the tungsten plug 42 in the drain region 38b in a direction to cross the control gate line 37a. As shown in FIG. 11, the metal pattern 43 is formed to have a line structure in one direction in contact with the common source contact region such that the metal pattern is connected to the source regions 38a in the cell transistor regions in common.

The nonvolatile memory and the method for fabricating the same as has been explained has the following advantages.

First, the formation of the selection transistor by stacking the first and second polysilicon layers in a way identical to the cell transistor can prevent formation of an unnecessary trench between the selection transistor and the cell transistor, that gives damages to the impurity region therein.

Second, the isolation of the second polysilicon layer in the selection transistor having the first and second polysilicon layers reduces a resistance in the second polysilicon in an upper portion of the selection gate line.

Third, the connection of the selection gate line of the selection transistor to the second polysilicon layer through the tungsten plug can prevent an increase of resistance in the selection gate line.

It will be apparent to those skilled in the art that various modifications and variations can be made in the nonvolatile memory and a method for fabricating the same of the present invention without departing from the spirit or scope of the invention. Thus, it is intended that the present invention cover the modifications and variations of this invention provided they come within the scope of the appended claims and their equivalents.

What is claimed is:

1. A nonvolatile memory comprising:
   a semiconductor substrate having a selection transistor and a cell transistor defined thereon;
   a line form of a first selection gate line formed on the selection transistor region in one direction and a floating gate formed on the cell transistor region in a fixed pattern;
   an insulating film and a second gate line formed on the first selection gate line at fixed intervals, and an insulating film and a control gate line over the insulating film including the floating gate in a direction the same with the first gate line;
   impurity regions formed in one region in the semiconductor substrate on both sides of the control gate line and the first selection gate line;
   a first planar protection film having first contact holes one each to the first selection gate line and to the impurity region;
   a contact plug in the first contact hole;
   a conductive layer pattern in contact with the contact plug;
   a second planar protection film having a contact hole to the conductive layer pattern over the first selection gate line; and,
   a wiring line formed on the second contact hole and the second planar protection film in one direction.

2. A nonvolatile memory as claimed in claim 1, wherein a gate insulating film is provided under each of the first selection gate line and the floating gate.

3. A nonvolatile memory as claimed in claim 2, wherein the gate insulating film provided under the first selection gate line is thicker than the gate insulating film provided under the floating gate.

4. A nonvolatile memory as claimed in claim 1, wherein the insulating film is of an ONO (Oxide Nitride Oxide) structure.

5. A nonvolatile memory as claimed in claim 1, wherein the second selection gate line is electrically floated on the first selection gate line by the first planar protection film.

6. A nonvolatile memory as claimed in claim 1, wherein the first contact hole is formed such that the first planar protection film wraps one side of the second selection gate line.

7. A nonvolatile memory as claimed in claim 1, wherein the first contact hole is formed to an upper region of the first selection gate line at which the second selection gate line is isolated.

8. A nonvolatile memory comprising:
   a semiconductor substrate having a selection transistor and a cell transistor defined thereon;
   a stack of a gate insulating film and a first selection gate line formed in line forms on the selection transistor region in one direction and a stack of a gate insulating film and a floating gate formed in fixed patterns on the cell transistor region;
   an insulating film and a second gate line formed on the first selection gate line at fixed intervals, and an insulating film and a control gate line over the insulating film including the floating gate in a direction the same with the first gate line;
   impurity regions formed in one region in the semiconductor substrate on both sides of the control gate line and the first selection gate line;
   a planar protection film having contact holes one each to the first selection gate line to expose sides of the second gate line and to the impurity region;
   a contact plug formed in the first contact hole, such that the second selection gate line is connected to the first selection gate line; and,
   a wiring line formed on the contact hole to the impurity region and the planar protection film in one direction.

9. A nonvolatile memory as claimed in claim 8, wherein the gate insulating film on the selection transistor region is thicker than the gate insulating film on the cell transistor region.

10. A nonvolatile memory as claimed in claim 8, wherein the insulating film is of an ONO(Oxide Nitride Oxide) structure.

11. A nonvolatile as claimed in claim 8, wherein the contact hole is formed in a region the second selection line is isolated.

* * * * *